(12) United States Patent
Fukuchi

(10) Patent No.: US 11,189,742 B2
(45) Date of Patent: Nov. 30, 2021

(54) PHOTO-DETECTION DEVICE, PHOTO-DETECTION SYSTEM, AND MOBILE APPARATUS

(71) Applicant: CANON KABUSHIKI KAISHA, Tokyo (JP)

(72) Inventor: Yusuke Fukuchi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/372,352

(22) Filed: Apr. 1, 2019

(65) Prior Publication Data

US 2019/0319154 A1    Oct. 17, 2019

(30) Foreign Application Priority Data

Apr. 11, 2018    (JP) .............................. JP2018-076164

(51) Int. Cl.
| | |
|---|---|
| *H01L 31/107* | (2006.01) |
| *H01L 31/02* | (2006.01) |
| *H01L 27/146* | (2006.01) |
| *B60R 11/04* | (2006.01) |
| *G01S 7/4861* | (2020.01) |
| *G01S 17/10* | (2020.01) |

(52) U.S. Cl.
CPC ............ *H01L 31/107* (2013.01); *B60R 11/04* (2013.01); *G01S 7/4861* (2013.01); *G01S 17/10* (2013.01); *H01L 27/1463* (2013.01); *H01L 27/14621* (2013.01); *H01L 27/14645* (2013.01); *H01L 31/02027* (2013.01)

(58) Field of Classification Search
CPC ........... H01L 27/1463; H01L 31/02027; H01L 31/107; H01L 27/14621; H01L 21/14645; B60R 11/04; G01S 7/4861; G01S 17/10
See application file for complete search history.

(56) References Cited

U.S. PATENT DOCUMENTS

| | | | | |
|---|---|---|---|---|
| 3,887,936 A | * | 6/1975 | Shannon .................... | H01J 1/34 257/80 |
| 4,241,358 A | * | 12/1980 | Wade ................. | H01L 31/02024 257/461 |
| 5,298,788 A | * | 3/1994 | Moreau ................. | H01L 29/866 257/511 |
| 5,861,655 A | * | 1/1999 | Kozuka ............. | H01L 27/14623 257/435 |
| 6,049,118 A | * | 4/2000 | Nagano ............... | H01L 27/1443 257/187 |
| 6,392,282 B1 | * | 5/2002 | Sahara ................ | H01L 27/1443 257/186 |

(Continued)

FOREIGN PATENT DOCUMENTS

JP    WO 2018/061334    *    4/2018    .......... H01L 31/107

*Primary Examiner* — Jay C Kim
(74) *Attorney, Agent, or Firm* — Venable LLP

(57) ABSTRACT

Provided is a photo-detection device including: a semiconductor substrate having a first face; a pixel unit in which a pixel having an avalanche diode is arranged in the semiconductor substrate; and a sixth semiconductor region arranged so as to surround a first semiconductor region to a fifth semiconductor region that form the avalanche diode in a planar view from a direction perpendicular to the first face, and an electric potential that is different from the electric potential supplied to the avalanche diode is supplied to the sixth semiconductor region.

11 Claims, 8 Drawing Sheets

(56) References Cited

U.S. PATENT DOCUMENTS

| | | | | |
|---|---|---|---|---|
| 6,649,951 | B2* | 11/2003 | Kozuka | H01L 27/14603 257/292 |
| 7,019,338 | B1* | 3/2006 | Ballon | H01L 27/0248 257/173 |
| 7,187,017 | B2* | 3/2007 | Sawase | H01L 27/1463 257/222 |
| 7,250,325 | B2* | 7/2007 | Janesick | H01L 27/14609 257/E27.132 |
| 7,262,402 | B2* | 8/2007 | Niclass | H01L 27/14647 250/208.1 |
| 7,576,369 | B2* | 8/2009 | Bui | H01L 27/1446 257/127 |
| 7,705,285 | B2* | 4/2010 | Lysen | H01L 31/02005 250/214 R |
| 7,723,668 | B2* | 5/2010 | Lysen | H01L 31/02005 250/206.1 |
| 7,749,800 | B2* | 7/2010 | Omi | H01L 31/103 438/94 |
| 7,898,001 | B2* | 3/2011 | Richardson | H01L 31/107 257/186 |
| 8,093,633 | B2* | 1/2012 | Poenar | H01L 31/1884 257/257 |
| 8,188,563 | B2* | 5/2012 | Finkelstein | H01L 31/02027 257/481 |
| 8,217,436 | B2* | 7/2012 | Henderson | H01L 31/107 257/292 |
| 8,258,594 | B2* | 9/2012 | Richter | H01L 31/107 257/432 |
| 8,259,293 | B2* | 9/2012 | Andreou | H01L 27/14603 356/222 |
| 8,471,293 | B2* | 6/2013 | Sanfilippo | H01L 27/1446 257/186 |
| 8,476,730 | B2* | 7/2013 | Sanfilippo | H01L 31/022416 257/428 |
| 8,552,482 | B2* | 10/2013 | Henderson | H01L 31/107 257/292 |
| 8,669,640 | B2* | 3/2014 | Lin | H01L 29/66234 257/586 |
| 8,723,100 | B2* | 5/2014 | Sanfilippo | H01L 27/1446 250/214.1 |
| 8,836,833 | B2* | 9/2014 | Yamashita | H01L 27/14609 348/294 |
| 8,860,166 | B2* | 10/2014 | Sanfilippo | H01L 31/107 257/438 |
| 8,921,900 | B2* | 12/2014 | Iida | H01L 31/02 257/225 |
| 9,054,261 | B2* | 6/2015 | Teva | H01L 31/101 |
| 9,105,789 | B2* | 8/2015 | Mazzillo | H01L 31/107 |
| 9,178,100 | B2* | 11/2015 | Webster | H01L 31/1804 |
| 9,209,336 | B2 | 12/2015 | Sanfilippo | |
| 9,293,626 | B2* | 3/2016 | Jonak-Auer | H01L 27/14609 |
| 9,362,326 | B2* | 6/2016 | Kikuchi | H01L 27/146 |
| 9,728,667 | B1* | 8/2017 | Johnson | H01L 27/1446 |
| 10,103,285 | B1* | 10/2018 | Lo | H01L 31/107 |
| 10,153,310 | B2* | 12/2018 | Zhang | H01L 27/14603 |
| 10,217,889 | B2* | 2/2019 | Dhulla | H01L 27/1446 |
| 10,283,651 | B2* | 5/2019 | Morimoto | H01L 31/1136 |
| 10,283,664 | B2* | 5/2019 | Stark | H01L 31/107 |
| 10,374,114 | B2* | 8/2019 | Teva | H01L 31/03529 |
| 10,436,581 | B2* | 10/2019 | Lee | G01C 3/02 |
| 10,497,822 | B2* | 12/2019 | Morimoto | G01S 7/4861 |
| 10,697,829 | B2* | 6/2020 | Delic | G06F 13/38 |
| 10,777,597 | B2* | 9/2020 | Ogi | H01L 27/14685 |
| 10,847,668 | B2* | 11/2020 | Takimoto | H01L 27/14643 |
| 10,971,644 | B2* | 4/2021 | Iwata | G01S 17/931 |
| 2014/0191115 | A1* | 7/2014 | Webster | H01L 27/14609 250/214 R |
| 2018/0158849 | A1* | 6/2018 | Henkel | H01L 27/1443 |
| 2020/0028019 | A1* | 1/2020 | Takimoto | H01L 31/02027 |

* cited by examiner

PHOTO-DETECTION DEVICE, PHOTO-DETECTION SYSTEM, AND MOBILE APPARATUS

BACKGROUND OF THE INVENTION

Field of the Invention

The present invention relates to a photo-detection device, a photo-detection system, and a mobile apparatus.

Description of the Related Art

Conventionally, a photo-detection device capable of detecting a faint light at a single photon level by utilizing avalanche (electron avalanche) amplification is known. U.S. Pat. No. 9,209,336, Specification discloses a Single Photon Avalanche Diode (SPAD) in which a photo-charge caused by a single photon that enters a photoelectric conversion unit causes avalanche amplification at a PN junction region that forms the photoelectric conversion unit.

Further, in the SPAD in U.S. Pat. No. 9,209,336, a P-type semiconductor region having a high impurity concentration is arranged on the surface of a semiconductor substrate, and an N-type semiconductor region is arranged under the P-type semiconductor region. The N-type semiconductor region is arranged so as to be included in an N-type epitaxial layer. The P-type semiconductor region and the N-type semiconductor region form a PN junction, and a reverse bias voltage is applied to the PN junction.

One of the schemes to improve detection performance of a photo-detection device using an avalanche diode is to reduce leakage of charges from a pixel. U.S. Pat. No. 9,209,336 discloses a scheme in which an insulating region containing an insulating material is provided between pixels.

SUMMARY OF THE INVENTION

The present invention intends to provide a photo-detection device that can improve the detection performance by another scheme.

According to an aspect of the present invention, provided is a photo-detection device including: a semiconductor substrate having a first face; and a pixel unit in which a pixel having an avalanche diode is arranged in the semiconductor substrate. The avalanche diode includes a first semiconductor region of a first conductivity type arranged at a first depth, a second semiconductor region arranged in contact with the first semiconductor region at the first depth, a third semiconductor region arranged at a second depth that is deeper than the depth of the first depth relative to the first face, a fourth semiconductor region of a second conductivity type arranged in contact with the third semiconductor region at the second depth in which the second conductivity type is the opposite conductivity type to the first conductivity type, and a fifth semiconductor region arranged at a third depth that is deeper than the depth of the second depth relative to the first face. The first semiconductor region overlaps at least a part of the third semiconductor region in a planar view when viewed from a direction perpendicular to the first face, and the second semiconductor region overlaps at least a part of the fourth semiconductor region in the planar view. The photo-detection device further includes a sixth semiconductor region of the second conductivity type arranged so as to surround the first semiconductor region to the fifth semiconductor region in the planar view, and an electric potential supplied to the fourth semiconductor region is different from an electric potential supplied to the sixth semiconductor region.

According to another aspect of the present invention, provided is a photo-detection device including: a plurality of pixels each including an avalanche diode that has a PN junction formed by a third semiconductor region of a first conductivity type and a fourth semiconductor region of a second conductivity type, the second conductivity type being the opposite conductivity type to the first conductivity type; and an isolation portion that has a sixth semiconductor region of the second conductivity type and electrically isolates each of the plurality of pixels. A first electric potential is supplied to the third semiconductor region, a second electric potential that is different from the first electric potential is supplied to the fourth semiconductor region such that an electric potential difference causing a reverse bias is applied to the PN junction, and a third electric potential that is different from both the first electric potential and the second electric potential is supplied to the sixth semiconductor region.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings. An element corresponding over a plurality of drawings is labeled with the common reference, and the description thereof may be omitted or simplified.

First Embodiment

Figure 1:
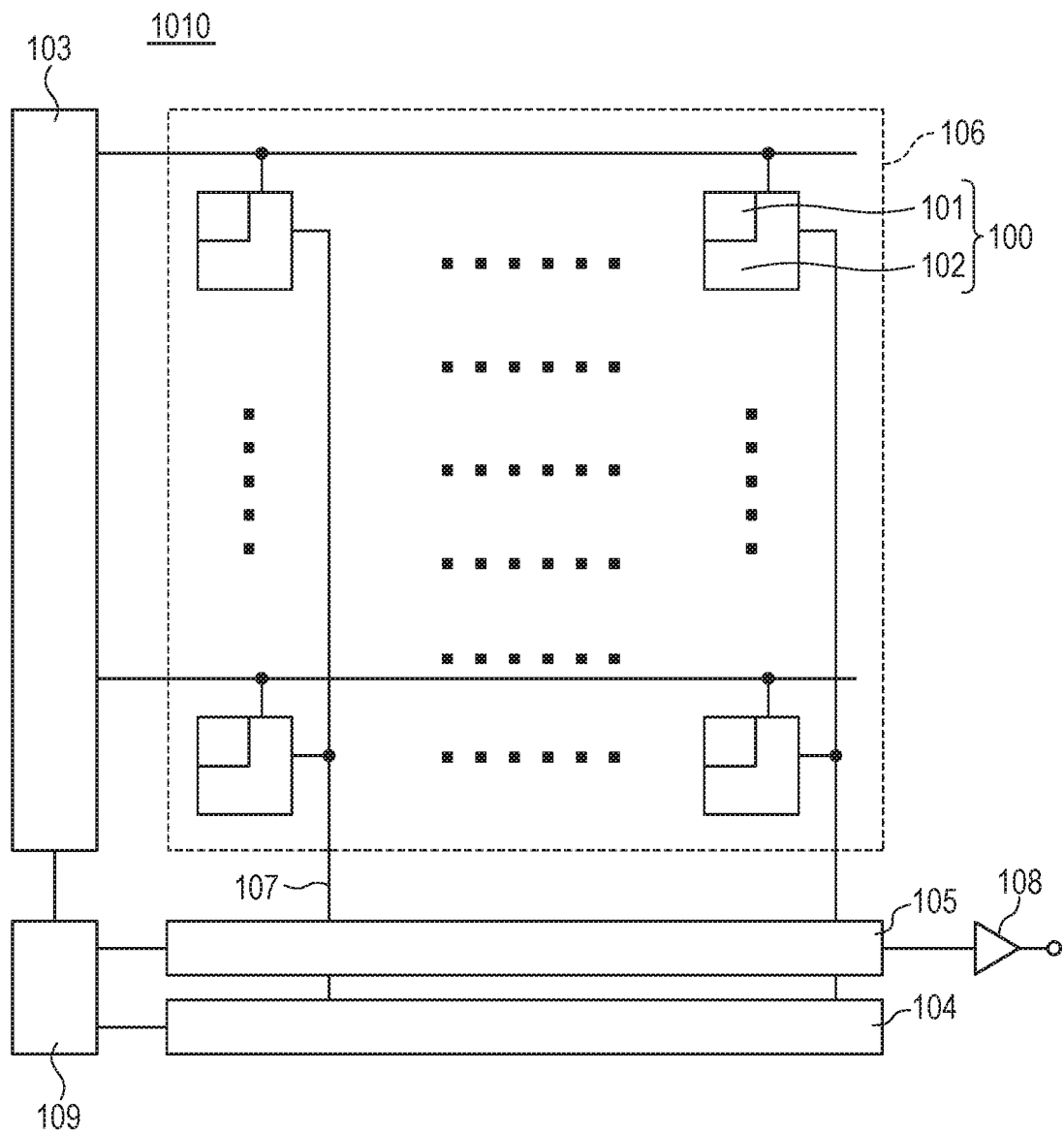
FIG. 1 is a block diagram illustrating a general configuration of a photo-detection device according to a first embodiment.

A photo-detection device according to a first embodiment will be described with reference to FIG. 1 to FIG. 5. FIG. 1 is a block diagram illustrating a general configuration of a photo-detection device 1010 according to the present embodiment. The photo-detection device 1010 has a vertical scanning circuit unit 103, a horizontal scanning circuit unit 104, a column circuit 105, a pixel unit 106, signal lines 107, an output circuit 108, and a control pulse generation unit 109.

The pixel unit 106 has a plurality of pixels 100 arranged in a matrix. Each of the pixels 100 includes a photoelectric conversion element 101 and a pixel signal processing unit 102. The photoelectric conversion element 101 photoelectrically converts an incident light into an electric signal. The pixel signal processing unit 102 outputs the converted electric signal to the column circuit 105.

Note that, in the present specification, the term "light" may include electromagnetic waves of all wavelengths. That is, the term "light" is not limited to a visible light and may include an invisible light such as an infrared ray, an ultraviolet ray, an X ray, a gamma ray, or the like.

The control pulse generation unit 109 generates control pulses used for driving the vertical scanning circuit unit 103, the horizontal scanning circuit unit 104, and the column circuit 105 and supplies the control pulses to each of these units. Thereby, the control pulse generation unit 109 controls the drive timing or the like of each unit.

The vertical scanning circuit unit 103 supplies a control pulse to each of the plurality of pixels 100 based on the control pulse supplied from the control pulse generation unit 109. As illustrated in FIG. 1, the vertical scanning circuit unit 103 supplies a control pulse to each pixel 100 on a row basis via a control signal line provided for each row of the pixel unit 106. A logic circuit such as a shift register, an address decoder, or the like may be used for the vertical scanning circuit unit 103.

The signal line 107 provided for each column of the pixel unit 106 transmits a signal output from the pixel 100 in the row selected by the vertical scanning circuit unit 103 to the column circuit 105 on the post-stage of the pixel 100 as an electric potential signal. The column circuit 105 performs a predetermined process on a signal of each pixel 100 input via the signal line 107. The predetermined process may be, for example, a process such as noise removal of the input signal, amplification, conversion of an output form, or the like. To implement these functions, the column circuit 105 may have a parallel-serial conversion circuit or the like.

The horizontal scanning circuit unit 104 supplies, to the column circuit 105, control pulses used for sequentially outputting the signal on which the predetermined process is performed to the output circuit 108 based on the control pulses supplied from the control pulse generation unit 109. The output circuit 108 includes a buffer amplifier, a differential amplifier, or the like and outputs the signal output from the column circuit 105 to an external storage unit or an external signal processing unit of the photo-detection device 1010.

In FIG. 1, the arrangement of the pixels 100 in the pixel unit 106 may be one-dimensional or may have only one pixel 100. When the pixels 100 in the pixel unit 106 are divided into several blocks, a plurality of vertical scanning circuits 103, a plurality of horizontal scanning circuits 104, and a plurality of column circuits 105 may be arranged to respective blocks. Further, the horizontal scanning circuit unit 104 and the column circuit 105 may be arranged on a column basis.

It is not essential that the pixel signal processing unit 102 be provided for every pixel 100 one by one. A single pixel signal processing unit 102 may be shared by a plurality of pixels 100, for example. In such a case, the pixel signal processing unit 102 provides a signal processing function to each pixel by sequentially processing the signals output from each photoelectric conversion unit 101.

Further, the pixel signal processing unit 102 may be provided with a semiconductor substrate that is different from the semiconductor substrate with which the photoelectric conversion element 101 is provided. In such a case, the ratio of an area capable of receiving light (aperture ratio) in the photoelectric conversion element 101 is improved, and thereby the sensitivity can be improved. In such a case, the photoelectric conversion element 101 and the pixel signal processing unit 102 are electrically connected to each other via a connection wiring provided for each of the pixels 100. Further, the vertical scanning circuit unit 103, the horizontal scanning circuit unit 104, and the column circuit 105 may also be provided with a semiconductor substrate that is different from the semiconductor substrate with which the photoelectric conversion element 101 is provided in a similar manner to the pixel signal processing unit 102.

Figure 2:
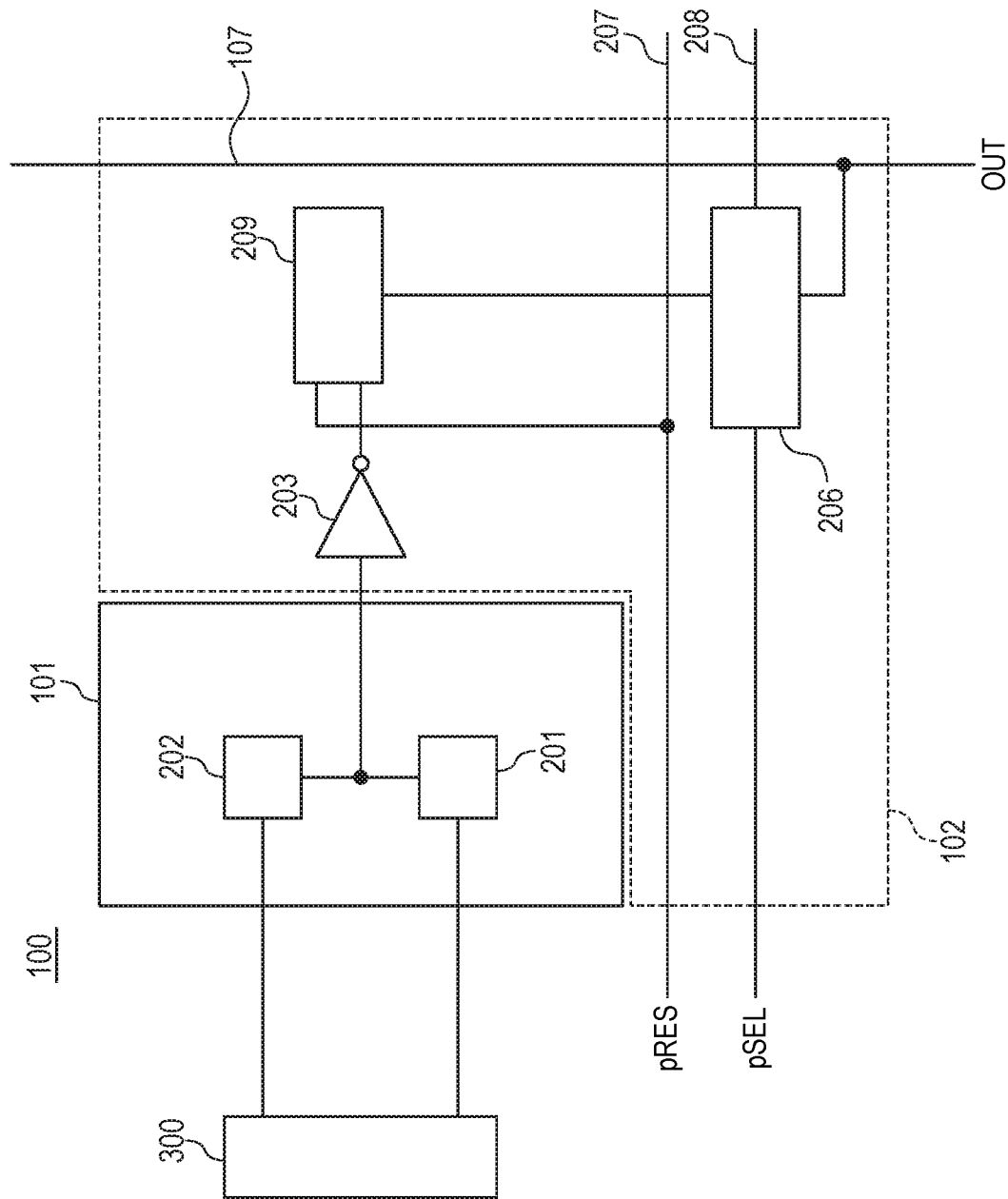
FIG. 2 is a circuit diagram illustrating a configuration example of a pixel according to the first embodiment.

FIG. 2 is a circuit diagram illustrating a configuration example of the pixel 100 according to the present embodiment. The pixel 100 has the photoelectric conversion element 101 and the pixel signal processing unit 102. The photoelectric conversion element 101 has a photoelectric conversion unit 201 and a control unit 202.

The photoelectric conversion unit 201 generates charge pairs corresponding to an incident light by photoelectric conversion. An avalanche diode is used for the photoelectric conversion unit 201. A predetermined electric potential is supplied to the anode and the cathode of the photoelectric conversion unit 201, respectively. The electric potential supplied to the cathode of the photoelectric conversion unit 201 is higher than the electric potential supplied to the anode. These electric potentials are supplied from the electric potential supply unit 300 inside the photo-detection device 1010 via a plurality of power source lines.

The anode and the cathode of the photoelectric conversion unit 201 are here supplied with the electric potentials by which an electric potential difference of reverse bias is applied so that charges generated in the photoelectric conversion unit 201 may cause avalanche amplification. When charges are generated by an incident light with such an electric potential difference of reverse bias being supplied, an avalanche current is generated by avalanche amplification.

Note that, when an electric potential difference of reverse bias is supplied and the electric potential difference between the anode and the cathode is larger than the breakdown voltage of the avalanche diode, the avalanche diode operates in a Geiger mode. A photodiode that detects a faint signal in a single photon level at a high speed in the Geiger mode is referred to as an SPAD.

Further, when the electric potential difference between the anode and the cathode of the photoelectric conversion unit 201 is greater than or equal to the electric potential by which charges generated in the photoelectric conversion unit 201 cause avalanche amplification and less than or equal to the breakdown voltage, the avalanche diode operates in a linear mode. The avalanche diode performing photo-detection in a linear mode is referred to as an avalanche photodiode (APD). In the present embodiment, the photoelectric conversion unit 201 may operate as an avalanche diode of either an SPAD or an APD.

The control unit 202 is connected to the electric potential supply unit 300 and the photoelectric conversion unit 201. The control unit 202 has a function of replacing a change of an avalanche current generated in the photoelectric conversion unit 201 with a voltage signal. Further, the control unit 202 functions as a load circuit (quench circuit) during signal amplification due to avalanche amplification and has a function of suppressing avalanche amplification by suppressing the voltage supplied to the photoelectric conversion unit 201 (quenching operation). A specific example of a circuit element that forms the control unit 202 may be a resistance element or an active quench circuit. The active quench circuit actively suppresses avalanche amplification by detecting an increase in the avalanche current and performing feedback control.

The pixel signal processing unit 102 has a waveform shaping unit 203, a select circuit 206, and a counter circuit 209. The waveform shaping unit 203 shapes a voltage change and outputs a pulse signal when a signal voltage at a single photon level is input from the photoelectric conversion element 101. A specific example of a circuit element that forms the waveform shaping unit 203 may be an inverter circuit. While FIG. 2 illustrates a circuit configuration in which a single inverter circuit is provided as the waveform shaping unit 203, another circuit can be used as long as it has a waveform shaping effect. For example, the waveform shaping unit 203 may be a circuit in which a plurality of inverter circuits are connected in series.

The counter circuit 209 counts the number of pulses of the pulse signals output from the waveform shaping unit 203. The counter circuit 209 may be formed of an N-bit counter (N: positive integer), for example. In such a case, the counter circuit 209 can count the number of pulses up to around the N-th power of 2 at the maximum. The count number is held in the counter circuit 209 as a detection signal. Further, a control pulse pRES is provided from the vertical scanning circuit unit 103 illustrated in FIG. 1 to the counter circuit 209 via a drive line 207. When the control pulse pRES is supplied to the counter circuit 209, the held count number is reset.

The select circuit 206 switches the electrical connection/disconnection state between the counter circuit 209 and the signal line 107. A control pulse pSEL is supplied from the vertical scanning circuit unit 103 illustrated in FIG. 1 to the select circuit 206 via a drive line 208. When the control pulse pSEL is supplied to the select circuit 206, the electrical connection/disconnection state between the counter circuit 209 and the signal line 107 is switched in accordance with the level of the control pulse pSEL. The select circuit 206 may include a transistor, a buffer circuit used for outputting a signal to the outside of the pixel 100, or the like, for example. When the counter circuit 209 and the signal line 107 are electrically connected, a digital signal that indicates a count value of the detection signals held in the counter circuit 209 is transmitted to the signal line 107.

Note that, instead of the select circuit 206, a switch such as a transistor may be provided to a node between the control unit 202 and the photoelectric conversion unit 201, a node between the photoelectric conversion element 101 and the pixel signal processing unit 102, or the like. In such a case, the same function as that of the select circuit 206 can also be implemented by switching the connection/disconnection state of the switch. Similarly, the same function as that of the select circuit 206 can also be implemented by switching the presence/absence of an electric potential supplied to the control unit 202 or the photoelectric conversion element 101 by using a switch such as a transistor.

Each pixel 100 in the pixel unit 106 can be driven by a rolling shutter operation or a global electronic shutter operation. A signal acquired from each pixel 100 may be used for generation of an image based on a light entering the pixel unit 106.

The rolling shutter operation is an operation of performing reset of the count value in the counter circuit 209 and output of the signal from the counter circuit 209 sequentially on a row basis at different timings. The global electronic shutter operation is an operation of performing reset of the counts in the counter circuits 209 simultaneously on all the rows and then outputting the signals held in the counter circuits 209 sequentially on a row basis.

Note that, when performing the global electronic shutter operation, in order to set the time for counting pulses to be the same on each row, it is preferable that an element that switches whether or not to perform the count of the counter circuit 209 be further added. The element that switches whether or not to perform the count may be, for example, a switch such as a transistor.

Further, instead of the counter circuit 209, a Time to Digital Converter circuit (hereafter, referred to as TDC) or a memory may be provided. In such a case, the photo-detection device 1010 can acquire a timing when a pulse is detected.

In this modified example, a generation timing of the pulse signal output from the waveform shaping unit 203 is converted into a digital signal by the TDC. The control pulse pREF as a reference signal used for measuring the timing of the pulse signal is supplied to the TDC from the vertical scanning circuit unit 103 via a drive line. The TDC acquires a digital signal corresponding to the time when the pulse is input from the waveform shaping unit 203 by using the control pulse pRES as a time reference.

The circuit of the TDC may use a Delay Line method that forms a delay circuit by using delay lines in which buffer circuits are connected in series, a Looped TDC scheme that uses a circuit in which delay lines are connected in a loop shape, or the like, for example. While another scheme may be used for the TDC circuit, the scheme preferably is capable of achieving a time resolution that is higher than or equal to the time resolution of the photoelectric conversion unit 201 in order to ensure sufficient time resolution.

A digital signal acquired by the TDC is held in one or a plurality of memories. When the number of memories is plural, it is possible to selectively output a signal from any one of the plurality of memories to the signal line 107 by supplying a plurality of control pulses pSEL to the select circuit 206.

Figure 3:
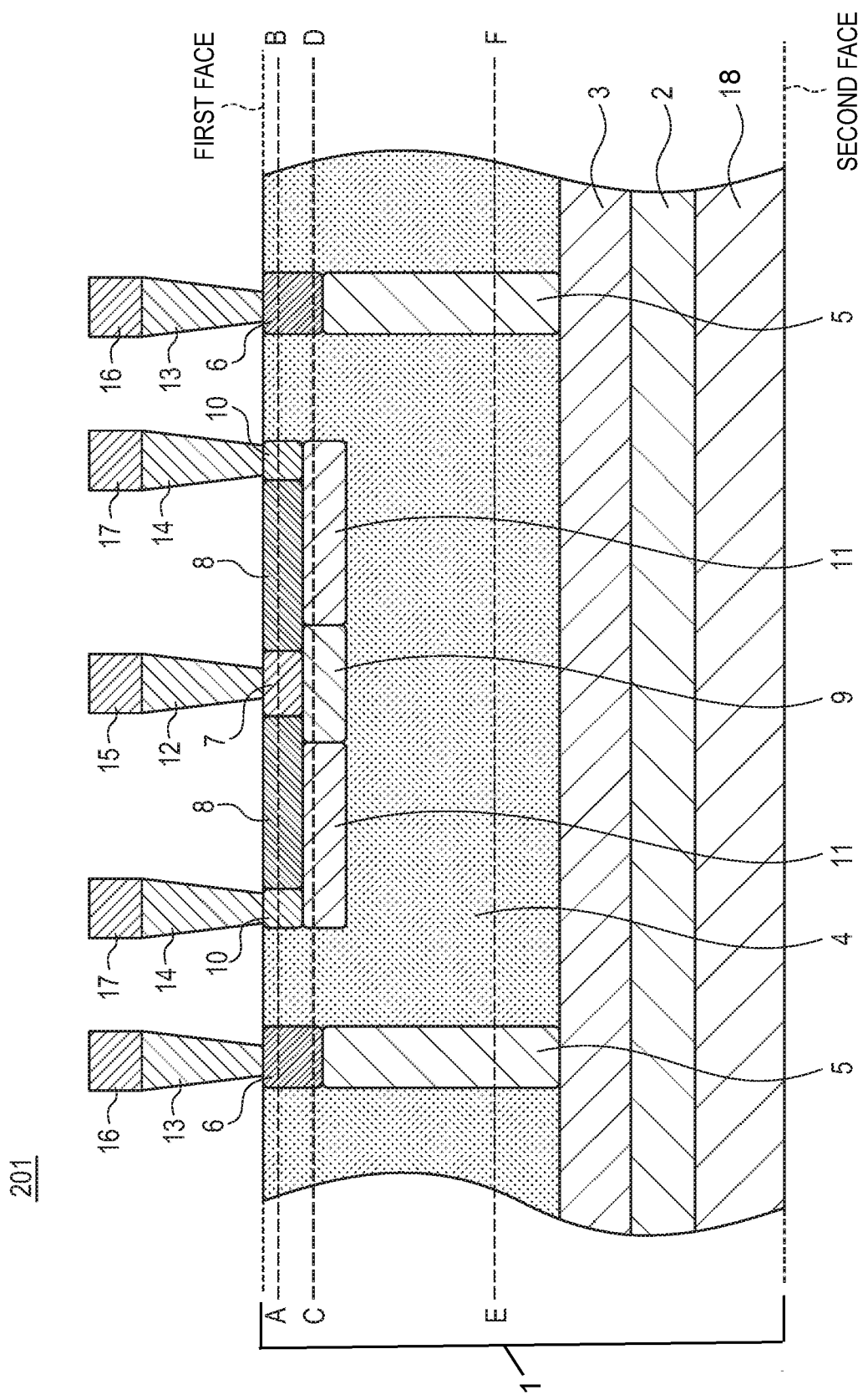
FIG. 3 is a schematic sectional view of a photoelectric conversion unit according to the first embodiment.
Figure 4:
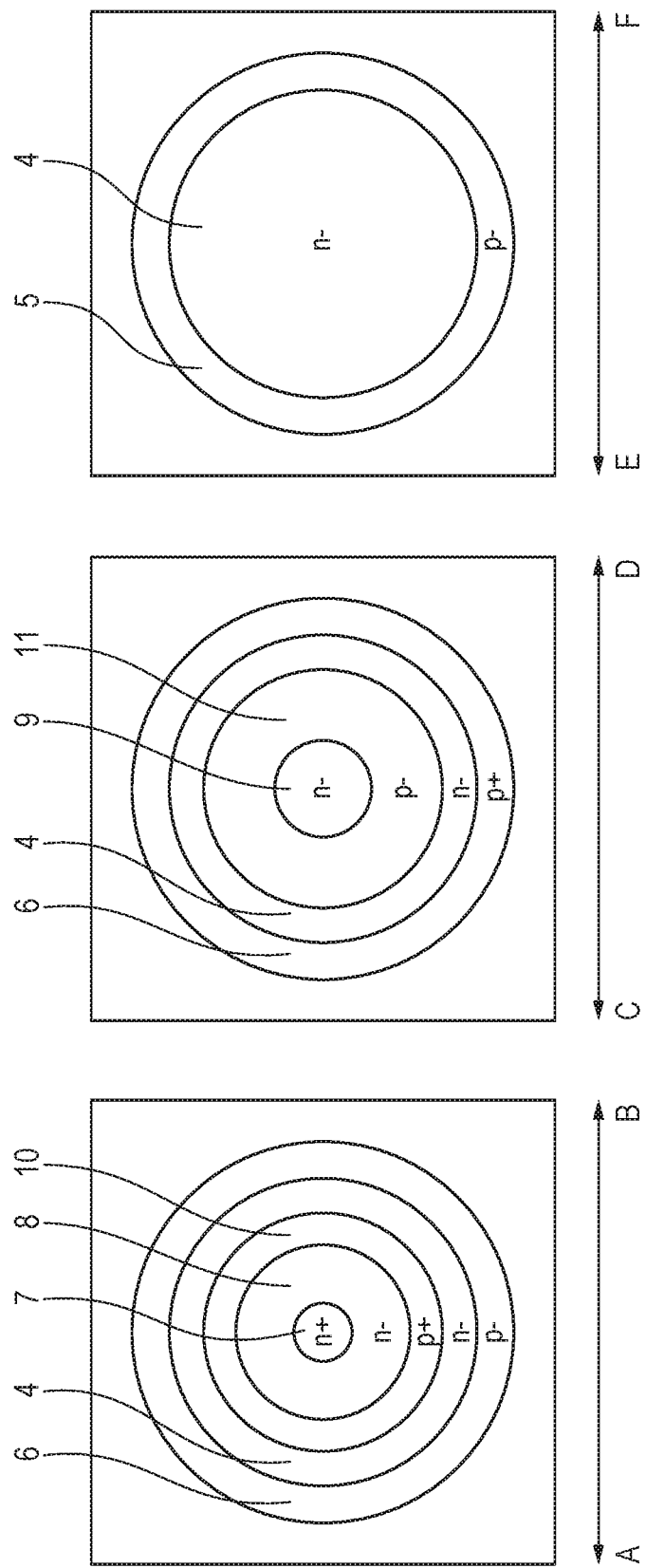
FIG. 4A, FIG. 4B, and FIG. 4C are schematic planar views of the photoelectric conversion unit according to the first embodiment.

FIG. 3 is a schematic sectional view of the photoelectric conversion unit 201 according to the first embodiment. The photoelectric conversion unit 201 is a semiconductor element formed in a substrate 1. The substrate 1 is a semiconductor substrate such as silicon, and includes an n-type semiconductor region. The substrate 1 has a first face and a second face facing the first face. A plurality of semiconductor regions are formed in the first face side of the substrate 1. In the photoelectric conversion unit 201, the impurity concentration in each semiconductor region is set so as to function as an avalanche diode.

Note that, while the conductivity type of charges used as signal charges out of electron pairs generated in the avalanche diode is n-type in the present embodiment, the conductivity type of charges used as signal charges may be p-type. By exchanging n-type and p-type in the description of the present embodiment, a configuration in which the charges used as the signal charges is p-type is realized. As more general expression, the conductivity type of charges used as signal charges may be referred to as a first conductivity type, and the conductivity type opposite to the first conductivity type may be referred to as a second conductivity type.

The photoelectric conversion unit 201 has an n-type semiconductor region 2 formed on the n-type semiconductor region 18, a p-type semiconductor region 3 formed on the n-type semiconductor region 2, and an n-type semiconductor region 4 (a fifth semiconductor region) formed on the p-type semiconductor region 3. The n-type semiconductor region 2 is an epitaxial semiconductor layer, and the thickness of the n-type semiconductor region 2 can be selected from a range from 4 µm to 20 µm, for example.

The photoelectric conversion unit 201 further has p-type semiconductor regions 5 and 6 (sixth semiconductor regions) used for electrically isolating adjacent pixels from each other. The p-type semiconductor region 5 is formed on the p-type semiconductor region 3, and the p-type semiconductor region 5 and the p-type semiconductor region 3 are electrically connected to each other. At a depth of a line segment EF (third depth) illustrated in FIG. 3, the p-type semiconductor region 5 is arranged in contact with the n-type semiconductor region 4 (fifth semiconductor region). Further, the photoelectric conversion unit 201 has a p-type semiconductor region 6 connected to the p-type semiconductor region 5 on the p-type semiconductor region 5.

A contact plug 13 is formed on the p-type semiconductor region 6, and a wiring 16 is formed on the contact plug 13. The impurity concentration of the p-type semiconductor region 6 is higher than the impurity concentration of the p-type semiconductor region 5. Thereby, compared to a case where the contact plug 13 is connected to the p-type semiconductor region 5, the contact resistance between the p-type semiconductor region 6 and the contact plug 13 is reduced.

Further, the photoelectric conversion unit 201 has an n-type semiconductor region 9 (third semiconductor region) and a p-type semiconductor region 11 (fourth semiconductor region) formed on the n-type semiconductor region 4. At a depth of a line segment CD (second depth) illustrated in FIG. 3, the p-type semiconductor region 11 is arranged in contact with the n-type semiconductor region 9. Further, at the depth of the line segment CD, the n-type semiconductor region 4 is arranged in contact with the p-type semiconductor region 11. Further, at the depth of the line segment CD, the p-type semiconductor region 6 is arranged in contact with the n-type semiconductor region 4.

Further, the photoelectric conversion unit 201 has an n-type semiconductor region 7 (first semiconductor region), an n-type semiconductor region 8 (second semiconductor region) formed on the n-type semiconductor region 9, and a p-type semiconductor region 10 formed on the p-type semiconductor region 11. At a depth of a line segment AB (first depth) illustrated in FIG. 3, the n-type semiconductor region 8 is arranged in contact with the n-type semiconductor region 7. Further, at the depth of the line segment AB, the p-type semiconductor region 10 is arranged in contact with the n-type semiconductor region 8. Further, at the depth of the line segment AB, the n-type semiconductor region 4 (fifth semiconductor region) is arranged in contact with the p-type semiconductor region 10. Further, at the depth of the line segment AB, the p-type semiconductor region 6 is arranged in contact with the n-type semiconductor region 4.

A contact plug 12 is formed on the n-type semiconductor region 7, a wiring 15 is formed on the contact plug 12. A contact plug 14 is formed on the p-type semiconductor region 10, and a wiring 17 is formed on the contact plug 14.

The impurity concentration of the n-type semiconductor region 7 is higher than the impurity concentrations of the n-type semiconductor regions 8 and 9. With such impurity concentrations, the electric field of the depletion layer generated in the n-type semiconductor region 7 can be enhanced. Further, compared to a case where the contact plug 12 is connected to the n-type semiconductor regions 8 and 9, the contact resistance between the n-type semiconductor region 7 and the contact plug 12 is reduced. Further, since the impurity concentration of the n-type semiconductor region 7 is higher than the impurity concentration of the n-type semiconductor region 9, charges existing near the n-type semiconductor region 9 are facilitated to move to the n-type semiconductor region 7.

As described above, the impurity concentration of the n-type semiconductor region 8 is lower than the impurity concentration of the n-type semiconductor region 7, and specifically, it can be set as follows, for example. When the impurity concentration of the n-type semiconductor region 7 is higher than or equal to $6.0 \times 10^{18}$ [atms/cm$^3$], the impurity concentration of the n-type semiconductor region 8 is higher than or equal to $1.0 \times 10^{16}$ [atms/cm$^3$] and lower than or equal to $1.0 \times 10^{18}$ [atms/cm$^3$].

The p-type semiconductor region 10 is electrically connected to the p-type semiconductor region 11. The impurity concentration of the p-type semiconductor region 10 is higher than the impurity concentration of the p-type semiconductor region 11. Thereby, compared to a case where the contact plug 14 is connected to the p-type semiconductor region 11, the contact resistance between the p-type semiconductor region 10 and the contact plug 14 is reduced.

Next, with reference to FIG. 4A, FIG. 4B, and FIG. 4C, the planar structure of the photoelectric conversion unit 201 at each depth of line segments AB, CD, and EF illustrated in FIG. 3 will be described. Each diagram of FIG. 4A, FIG. 4B, and FIG. 4C is a schematic planar view when viewed from a direction perpendicular to the first face in a planar view.

Note that, while the shapes of each semiconductor region are represented by using a circle or a ring in FIG. 4A, FIG. 4B, and FIG. 4C, the shape is not limited thereto. Any shapes such as a square, a rectangle, a polygon, or the like can be used for the shape of each semiconductor region as long as the characteristics as an avalanche diode can be obtained.

FIG. 4A illustrates a schematic planar view at the depth of the line segment AB in FIG. 3. The n-type semiconductor region 8 is arranged so as to surround the n-type semiconductor region 7. Further, the area of the n-type semiconductor region 8 is larger than the area of the n-type semiconductor region 7. The p-type semiconductor region 10 is arranged so as to surround the n-type semiconductor region 8, and the n-type semiconductor region 4 is arranged so as to surround the p-type semiconductor region 10. Further, the p-type semiconductor region 6 is arranged so as to surround the n-type semiconductor region 4.

FIG. 4B illustrates a schematic planar view at the depth of the line segment CD in FIG. 3. The p-type semiconductor region 11 is arranged so as to surround the n-type semiconductor region 9, and the n-type semiconductor region 4 is arranged so as to surround the p-type semiconductor region 11. Further, the p-type semiconductor region 6 is arranged so as to surround the n-type semiconductor region 4.

FIG. 4C illustrates a schematic planar view at the depth of the line segment EF in FIG. 3. The p-type semiconductor region 5 is arranged so as to surround the n-type semiconductor region 4. As described above, the p-type semiconductor regions 5 and 6 are arranged so as to surround the n-type semiconductor regions 4, 7, 8, and 9 and the p-type semiconductor regions 10 and 11 in a planar view.

Note that, in a planar view in which FIG. 4B and FIG. 4C are overlapped each other, the n-type semiconductor region 9 and the p-type semiconductor region 11 overlap a part of the n-type semiconductor region 4. Further, in a planar view in which FIG. 4A and FIG. 4B are overlapped, the n-type semiconductor region 7 overlaps at least a part of the n-type semiconductor region 9, and the n-type semiconductor region 8 overlaps at least a part of the p-type semiconductor region 11.

Further, in a planar view, a whole region of the n-type semiconductor region 7 preferably overlaps the n-type semiconductor region 9.

Such a configuration does not form any PN junction between the n-type semiconductor region 7 and the p-type semiconductor region 11.

When a PN junction is formed between the n-type semiconductor region 7 and the p-type semiconductor region 11, avalanche amplification occurs and noise due to a tunneling effect may occur. In contrast, with the whole region of the n-type semiconductor region 7 being formed to overlap the n-type semiconductor region 9, the noise is reduced.

Figure 5:
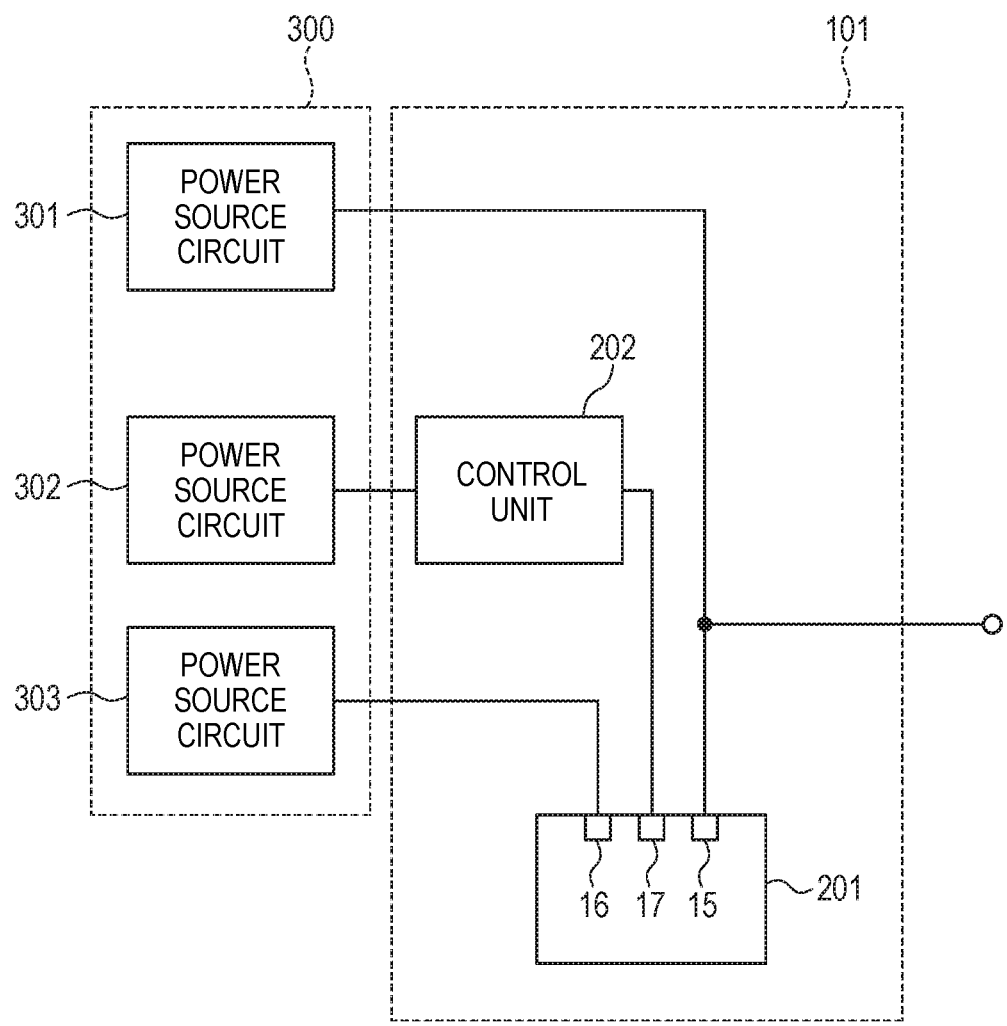
FIG. 5 is a circuit diagram illustrating a configuration example of an electric potential supply unit according to the first embodiment.

Electric potentials supplied to the wirings 15, 16, and 17 will be described with further reference to FIG. 5. FIG. 5 is a circuit diagram illustrating a configuration example of the electric potential supply unit 300 according to the present embodiment. The electric potential supply unit 300 has power source circuits 301, 302, and 303. Note that the circuits illustrated in FIG. 5 are schematic diagrams used for representing an electric potential supplied to each wiring, a position of an output terminal, or the like, and other elements may be further included. For example, a control circuit, a buffer circuit, or the like that controls the power source circuit 301, 302, or 303 may be included.

The power source circuit 301 supplies an electric potential to the wiring 15. The power source circuit 302 supplies an electric potential to the wiring 17 via the control unit 202. The power source circuit 303 supplies an electric potential to the wiring 16. The output from the wiring 15 is the output of the photoelectric conversion element 101.

The power source circuits 301, 302, and 303 are configured to be able to supply electric potentials different from each other. Thereby, the p-type semiconductor region 6 is supplied with an electric potential that provides an electric potential difference of reverse bias to the n-type semiconductor region 7. Further, the p-type semiconductor region 10 is also supplied with an electric potential that provides an electric potential difference of reverse bias to the n-type semiconductor region 7.

The p-type semiconductor region 11 and the n-type semiconductor region 9 form a PN junction. Because of the PN junction, the whole region of the n-type semiconductor region 9 is a depletion layer region. Further, the depletion layer region extends to a part of the region of the n-type semiconductor region 7. A strong electric field is induced in a portion of the depletion layer region extending to the n-type semiconductor region 7. Such a strong electric field causes avalanche amplification in the depletion layer region extending to a part of the region of the n-type semiconductor region 7, and a current based on the amplified charges is output to the wiring 15 via the contact plug 12.

Note that the impurity concentrations of the n-type semiconductor regions 7 and 9 and p-type semiconductor region 11 are set to the impurity concentrations such that, when the electric potential difference that causes avalanche amplification is applied to the depletion layer region formed in the part of the n-type semiconductor region 7, at least a part of the n-type semiconductor region 7 is not depleted. On the other hand, these impurity concentrations are set such that the whole region of the n-type semiconductor region 9 are depleted.

To implement such depletion regions described above, the impurity concentration of the n-type semiconductor region 7 is higher than or equal to $6.0 \times 10^{18}$ [atms/cm$^3$] in the present embodiment. Further, the impurity concentration of the n-type semiconductor region 9 is higher than or equal to $1.0 \times 10^{17}$ [atms/cm$^3$], and the impurity concentration of the p-type semiconductor region 11 is higher than or equal to $1.0 \times 10^{16}$ [atms/cm$^3$]. Note that the impurity concentrations are not limited thereto as long as the condition is obtained under which that the depletion layer as described above is formed.

The electric potential difference between the n-type semiconductor region 7 and the p-type semiconductor region 10 is set such that charges influenced by the electric field in the depth direction induced in the part of the depletion layer extending to the n-type semiconductor region 7 cause avalanche amplification. That is, the electric potential difference between the n-type semiconductor region 7 and the p-type semiconductor region 10 is higher than or equal to the breakdown voltage of the PN junction.

Specifically, the electric potential difference between the n-type semiconductor region 7 and the p-type semiconductor region 10 is higher than or equal to 6 V. In such a case, the whole region of the n-type semiconductor region 9 is the depletion layer region as described above, and a strong electric field such that avalanche amplification occurs in the depletion layer region extending to a part of the region of the n-type semiconductor region 7 is generated.

The impurity concentration of the n-type semiconductor region 4 is lower than or equal to the impurity concentration of the n-type semiconductor region 9. The impurity concentration of the n-type semiconductor region 4 is lower than or equal to $1.0 \times 10^{17}$ [atms/cm$^3$], for example. The impurity concentration of the n-type semiconductor region 4 is illustrated as being even in FIG. 3. However, the impurity concentration of the n-type semiconductor region 4 may have a gradient such that the potential structure is generated such that charges move to the first face side of the substrate 1. With such a gradient in impurity concentrations being provided, charges are facilitated to move from the n-type semiconductor region 4 to the n-type semiconductor region 7.

The p-type semiconductor region 3 is arranged at a position deeper than the n-type semiconductor region 4. The depth of the region where the photoelectric conversion is performed is defined by the depth of the p-type semiconductor region 3 from the first face. The n-type semiconductor region 4 forms a PN junction with the p-type semiconductor region 11, the p-type semiconductor region 5, and the p-type semiconductor region 3, respectively. The impurity concentration of the p-type semiconductor region 3 is set higher than the impurity concentration of the p-type semiconductor region 11. Thereby, charges generated near the p-type semiconductor region 3 are facilitated to move in the first face direction.

Similarly, the impurity concentration of the p-type semiconductor region 5 is set higher than the impurity concentration of the p-type semiconductor region 11. Thereby, charges generated near the p-type semiconductor region 5 are facilitated to move in the direction of the center of the n-type semiconductor region 4.

In the present embodiment, the p-type semiconductor regions 5 and 6 are formed so as to surround a plurality of semiconductor regions that function as avalanche diodes in a planar view. With the use of such a configuration, an electric potential different from the electric potential of reverse bias supplied to the avalanche diode can be supplied to the p-type semiconductor regions 5 and 6.

With the electric potential supplied to the p-type semiconductor regions 5 and 6 being set to be a reverse bias to the n-type semiconductor region 4 or the like, an electric potential barrier is formed in the p-type semiconductor regions 5 and 6. Thereby, the p-type semiconductor regions 5 and 6 function as an isolation portion that electrically isolates each of the pixels 100 from each other, and leakage of charges generated in the n-type semiconductor region 4 to the adjacent pixel 100 can be suppressed. Therefore, according to the present embodiment, a photo-detection device that can improve detection performance can be provided.

A specific example of the relationship of the electric potentials supplied to each semiconductor region will be described. The p-type semiconductor region 5 and the p-type semiconductor region 11 are supplied with an electric potential at which the semiconductor regions thereof causes a reverse bias to the n-type semiconductor region 9. The electric potential difference between the p-type semiconductor region 5 and the n-type semiconductor region 9 is preferably larger than the electric potential difference between the p-type semiconductor region 11 and the n-type semiconductor region 9. To describe the relationship, the electric potentials supplied to the n-type semiconductor region 9, the p-type semiconductor region 11, and the p-type semiconductor region 5 are denoted as a first electric potential, a second electric potential, and a third electric potential, respectively. In such a case, in other words, the relationship described above can also be described that the electric potential difference between the first electric potential and the third electric potential is larger than the electric potential difference between the first electric potential and the second electric potential. Thereby, the electric potential barrier of the p-type semiconductor regions 5 and 6 can be higher, and the advantage of suppressing leakage of charges can be further improved.

As a specific example of the electric potential value supplied to each semiconductor region, when an electric potential of 10 V is supplied to the n-type semiconductor region 9 and an electric potential of −5 V is supplied to the p-type semiconductor region 11, for example, an electric potential lower than −5 V is preferably supplied to the p-type semiconductor region 5. More specifically, an electric potential of −10 V is supplied to the p-type semiconductor region 5, for example. However, the electric potentials are not limited thereto.

Note that, when the electric potential difference between the p-type semiconductor region 5 and the p-type semiconductor region 11 is excessively large, punch-through may occur between the p-type semiconductor region 5 and the p-type semiconductor region 11. To avoid generation of punch-through, the electric potentials of the p-type semiconductor region 5 and the p-type semiconductor region 11 are preferably set such that the electric potential difference between the p-type semiconductor region 5 and the p-type semiconductor region 11 is lower than the breakdown voltage therebetween.

The operation performed by a quench circuit included in the control unit 202 may be either active quench or passive quench. However, the configuration of the present embodiment is more effective when active quench is performed in the control unit 202. The configuration will be described below.

In the configuration in which passive quench is performed in the control unit 202, a passive element such as a resistor element is employed in the control unit 202. When charges are generated from a light entering the avalanche diode and avalanche amplification occurs, an electric potential difference between a PN junctions temporally decreases due to an electric potential drop at a passive element.

It takes a certain period of time for the electric potential difference to return to the initial state where avalanche amplification has not yet occurred. This certain period of time is a recovery time that is referred to as a dead time, and the charges generated during the dead time are not amplified by avalanche amplification and thus not detected. In a configuration in which passive quench is performed in the control unit 202, a long dead time may cause a problem.

As a method to reduce such a dead time, active quench is known that forces an avalanche current to stop by using an external circuit or the like. In the configuration of the photoelectric conversion element 101 that may perform the active quench, the control unit 202 has an active quench circuit configured so as to be able to control the bias electric potential at any timing. The control unit 202 controls the electric potential supplied to the p-type semiconductor region 11 such that the electric potential difference between the n-type semiconductor region 7 and the p-type semiconductor region 10 at avalanche amplification is lower than the breakdown voltage of the PN junction, for example. Thereby, the control unit 202 can perform an active quench operation that forces avalanche amplification to stop.

When the active quench operation is performed, the dead time can be reduced compared to a case of performing passive quench. Thereby, the number of charges that can be counted per unit time increases, and the photo-detection device 1010 having a large dynamic range is provided.

The photo-detection device 1010 of the present embodiment can supply an electric potential different from the electric potential of a reverse bias supplied to the avalanche diode to the p-type semiconductor regions 5 and 6. Specifically, while a predetermined electric potential is supplied to the p-type semiconductor region 11 at the active quench operation, an electric potential different from the predetermined electric potential supplied to the p-type semiconductor region can be supplied to the p-type semiconductor regions 5 and 6. Therefore, even when the electric potential supplied from the control unit 202 is changed by the active quench, the electric potentials supplied to the p-type semiconductor regions 5 and 6 are not affected. Therefore, since the electric potential barriers of the p-type semiconductor regions 5 and 6 can be maintained at a constant height, leakage of charges at the active quench can be suppressed.

Second Embodiment

In the present embodiment, an example of a photo-detection system using the photo-detection device 1010 of the first embodiment will be described with reference to FIG. 6. The photo-detection system of the present embodiment is an invisible-light detection system that detects light in the wavelength band of invisible light and used for a medical diagnosis system such as a Positron Emission Tomography (PET). Components having the same functions as those of FIG. 1 to FIG. 5 are labeled with the same references, and the description thereof will be omitted or simplified. Note that the pixel 100 in the present embodiment has a TDC 204 and a memory 205 instead of the counter circuit 209 of FIG. 2.

Figure 6:
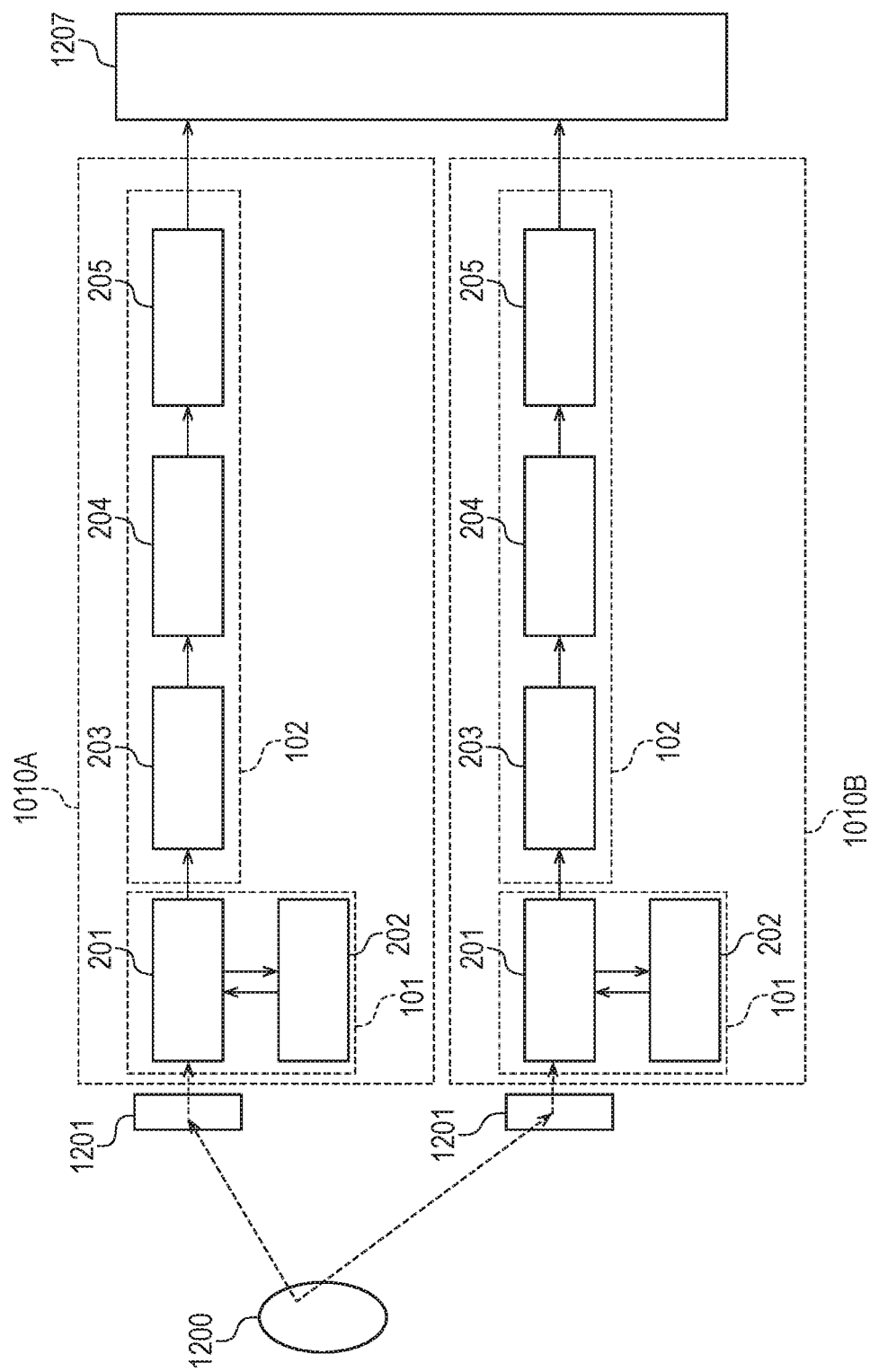
FIG. 6 is a block diagram of a photo-detection system according to a second embodiment.

FIG. 6 is a block diagram of the invisible-light detection system. The invisible-light detection system has a plurality of photo-detection devices 1010A and 1010B, a wavelength conversion unit 1201, and a data processing unit 1207. Each of the plurality of photo-detection devices 1010A and 1010B is the same as the photo-detection device 1010 of the first embodiment except that the TDC 204 and the memory 205 are provided instead of the counter circuit 209.

An emission object 1200 emits a light in the wavelength band of invisible light (first wavelength band). The wavelength conversion unit 1201 receives the invisible light emitted from the emission object 1200 and emits a light in the wavelength band of visible light (second wavelength band). The visible light emitted from the wavelength conversion unit 1201 enters the photoelectric conversion unit 201. The photoelectric conversion unit 201 photoelectrically converts the incident light into an electric signal. The electric signal is held in the memory 205 as a digital signal via the control unit 202, the waveform shaping unit 203, and the TDC 204. The plurality of photo-detection devices 1010A and 1010B may be formed as a single device or may be formed as a plurality of devices.

A plurality of digital signals held in the memories 205 in the plurality of photo-detection devices 1010A and 1010B are read out by the data processing unit 1207 to perform signal processing. The data processing unit 1207 functions as a signal processing unit that performs a synthesis process of a plurality of images obtained from the plurality of digital signals.

Next, the configuration of the medical diagnosis system such as a PET will be described as a specific example of the invisible-light detection system. An object that is the emission object 1200 emits radiation pairs such as a gamma ray from the living body. The wavelength conversion unit 1201 includes a scintillator, and the scintillator emits visible light in response to the incidence of the radiation pair emitted from the object.

The visible light emitted from the scintillator enters the photo-detection devices 1010A and 1010B, and the digital signals based on the incident light are stored in the memories 205. Thereby, the photo-detection devices 1010A and 1010B can detect the arrival time of each of the radiation pair emitted from the object.

The plurality of digital signals stored in the memories 205 in the plurality of photo-detection devices 1010A and 1010B are read out by the data processing unit 1207 to perform signal processing. The data processing unit 1207 performs a synthesis process such as image reconstruction by using a plurality of images obtained from the plurality of digital signals and generates an image inside the living body of the object.

According to the present embodiment, with the use of the photo-detection devices 1010A and 1010B in which the detection performance is improved, a photo-detection system with higher accuracy such as an invisible-light detection system, a medical diagnosis system, or the like can be provided.

Third Embodiment

In the present embodiment, another example of a photo-detection system using the photo-detection device 1010 of the first embodiment will be described with reference to FIG. 7, FIG. 8A and FIG. 8B. Components having the same functions as those of FIG. 1 to FIG. 5 are labeled with the same references, and the description thereof will be omitted or simplified.

First, a distance detection system that is an example of the photo-detection system will be described with reference to FIG. 7. Note that the pixel 100 of the present embodiment has the TDC 204 and the memory 205 instead of the counter circuit 209 in FIG. 2.

Figure 7:
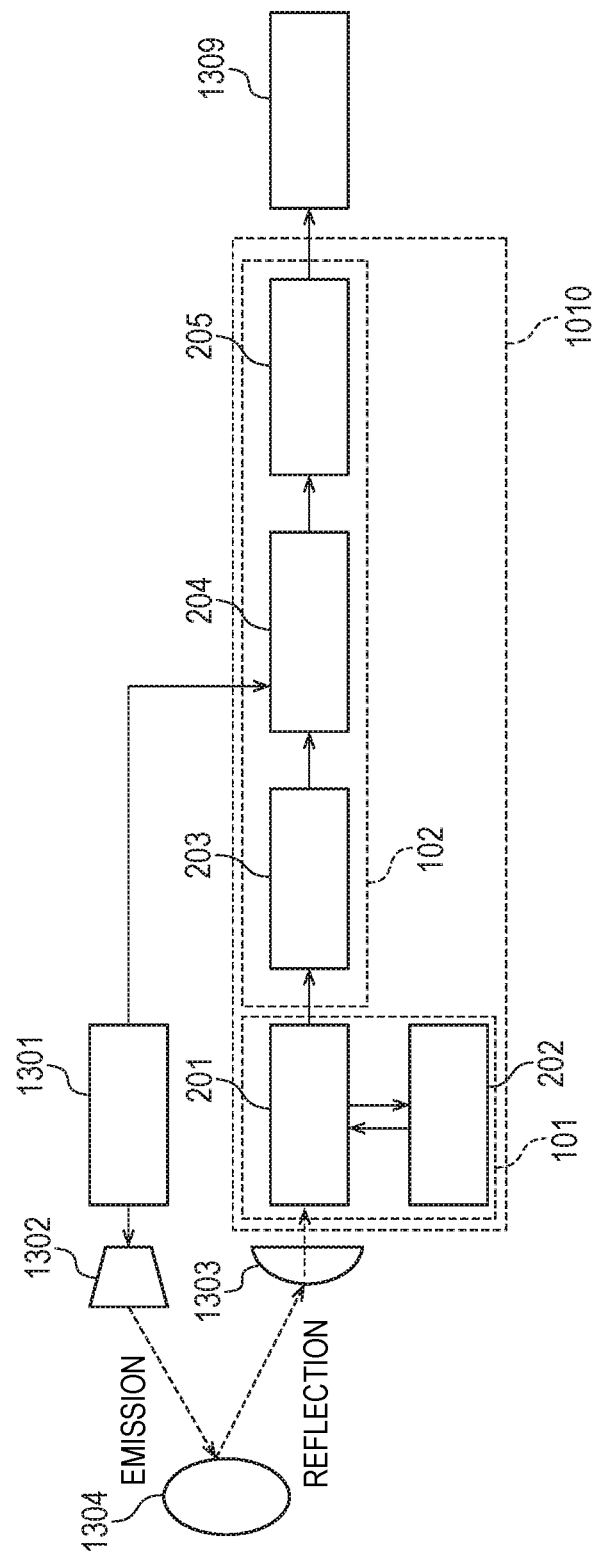
FIG. 7 is a block diagram of a photo-detection system according to a third embodiment.

FIG. 7 is a block diagram of the distance detection system. The distance detection system has a light source control unit 1301, a light emitting unit 1302, an optical member 1303, the photo-detection device 1010, and a distance calculation unit 1309.

The light source control unit 1301 controls driving of the light emitting unit 1302. The light emitting unit 1302 is a light emitting device that emits a light of short pulses (sequence) in the image capturing direction in response to the signal from the light source control unit 1301.

The light emitted from the light emitting unit 1302 is reflected by an object 1304. The reflected light is received at the photoelectric conversion unit 201 of the photo-detection device 1010 through the optical members 1303 such as a lens. The photoelectric conversion unit 201 outputs a signal based on the incident light, and the signal is input to the TDC 204 via the waveform shaping unit 203.

The TDC 204 acquires a signal indicating a timing of light emission from the light emitting unit 1302 from the light source control unit 1301. The TDC 204 compares the signal acquired from the light source control unit 1301 with the signal input from the waveform shaping unit 203. Thereby, the TDC 204 converts and outputs a time period from the time when a pulsed light is emitted by the light emitting unit 1302 to the time when the reflected light reflected by the object 1304 is received as a digital signal. The digital signal output from the TDC 204 is stored in the memory 205. The process is repeated for multiple times, and the memory 205 can store digital signals of a plurality of times of processing.

The distance calculation unit 1309 calculates a distance from the photo-detection device 1010 to the object 1304 based on the plurality of digital signals stored in the memory 205. The distance detection system can be applied to an on-vehicle distance detection device, for example. Note that, since a process performed in the distance calculation unit 1309 is digital signal processing, the process may be more generally referred to as a signal processing unit.

Next, a photo-detection system using the photo-detection device 1010 as an on-vehicle camera will be described with reference to FIG. 8A and FIG. 8B. FIG. 8A and FIG. 8B are diagrams illustrating a configuration of the photo-detection system 1000 and a mobile apparatus according to the present embodiment.

Figure 8A:
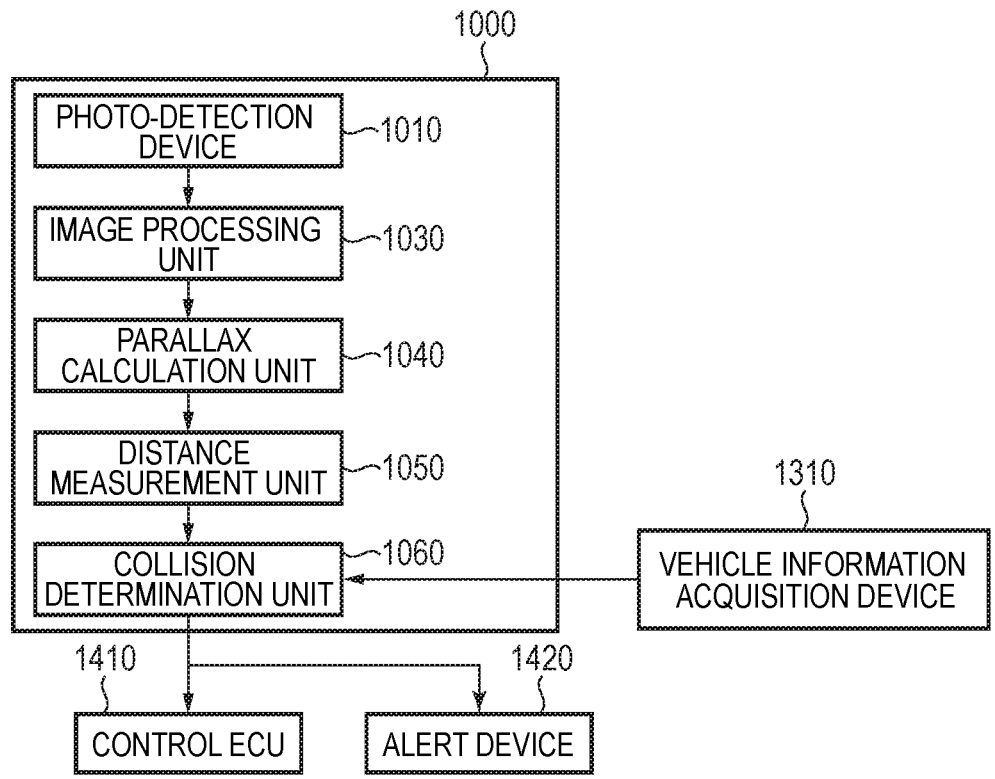
FIG. 8A and FIG. 8B are diagrams illustrating an example configuration of a photo-detection system and a mobile apparatus according to a fourth embodiment.
Figure 8B:
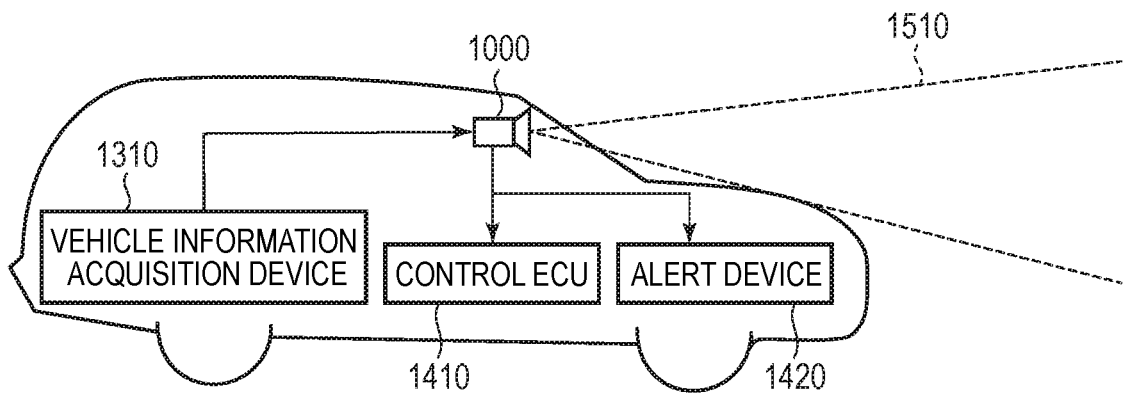

FIG. 8A is a block diagram illustrating an example of the photo-detection system 1000 related to an on-vehicle camera. The photo-detection system 1000 has the photo-detection device 1010 according to the first embodiment. The photo-detection system 1000 has an image processing unit 1030 that performs image processing on a plurality of digital signals acquired by the photo-detection device 1010. The photo-detection system 1000 further has a parallax calculation unit 1040 that calculates a parallax (a phase difference of parallax images) from the plurality of image data acquired by the image processing unit 1030.

Further, the photo-detection system 1000 has a distance measurement unit 1050 that calculates a distance to the object based on the calculated parallax and a collision determination unit 1060 that determines whether or not there is a collision possibility based on the calculated distance. Here, the parallax calculation unit 1040 and the distance measurement unit 1050 are an example of a distance information acquisition unit that acquires distance information on the distance to the object. That is, the distance information is information on a parallax, a defocus amount, a distance to an object, or the like.

The collision determination unit 1060 may use any of the distance information to determine the collision possibility. The distance information acquisition unit may be implemented by dedicatedly designed hardware, may be implemented by a software module, or may be implemented by combination thereof. Further, the distance information acquisition unit may be implemented by a Field Programmable Gate Array (FPGA), an Application Specific Integrated Circuit (ASIC), or the like. Further, combination of the components described above may be used for implementation.

The photo-detection system 1000 is connected to the vehicle information acquisition device 1310 and can acquire vehicle information such as a vehicle speed, a yaw rate, a steering angle, or the like. Further, the photo-detection system 1000 is connected to a control ECU 1410, which is a control device that outputs a control signal for causing a vehicle to generate braking force based on a determination result by the collision determination unit 1060.

Further, the photo-detection system 1000 is connected with an alert device 1420 that issues an alert to the driver based on a determination result by the collision determination unit 1060. For example, when the collision probability is high as the determination result of the collision determination unit 1060, the control ECU 1410 performs vehicle control to avoid a collision or reduce damage by applying a brake, pushing back an accelerator, suppressing engine power, or the like. The alert device 1420 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the photo-detection system 1000. FIG. 8B illustrates the photo-detection system 1000 in a case of capturing a front area of a vehicle (a capturing area 1510). The vehicle information acquisition device 1310 transmits instructions to the photo-detection system 1000 or the photo-detection device 1010 so as to perform a predetermined operation. Such a configuration enables further improvement of the ranging accuracy.

Although a control of avoiding a collision to another vehicle has been described in the example described above, the photo-detection system 1000 is applicable to automatic driving control for following another vehicle, automatic driving control for not going out of a traffic lane, or the like. Furthermore, the photo-detection system 1000 can be applied to not only a vehicle but also a mobile apparatus (moving apparatus) such as a ship, an airplane, or an industrial robot, for example. In addition, the photo-detection system can be widely applied to a device which utilizes object recognition, such as an intelligent transportation system (ITS), without being limited to mobile apparatuses.

According to the present embodiment, by using the photo-detection device 1010 with the improved detection performance, the photo-detection system and the mobile apparatus with higher performance can be provided.

Modified Embodiments

The present invention is not limited to the embodiments described above, and various modifications are possible. An example in which a part of the configuration of any of the embodiments is added to another embodiment or an example in which a part of the configuration of any of the embodiments is replaced with a part of the configuration of another embodiment is one of the embodiments of the present invention, for example.

Further, the devices or the systems illustrated in the second and third embodiments illustrate example configurations of a device or a system to which the photo-detection device of the present invention may be applied, and a device or a system to which the photo-detection device of the present invention can be applied is not limited to those configurations illustrated in FIG. 6, FIG. 7, FIG. 8A and FIG. 8B.

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-076164, filed Apr. 11, 2018, which is hereby incorporated by reference herein in its entirety.

What is claimed is:
1. A photo-detection device comprising:
a semiconductor substrate having a first face;
a voltage supply unit; and
a pixel unit in which at least one pixel having an avalanche diode is arranged in the semiconductor substrate,
wherein, in a sectional view of the semiconductor substrate, the avalanche diode comprises:
a first semiconductor portion of a first conductivity type;
a second semiconductor portion of the first conductivity type arranged in contact with the first semiconductor portion;
a third semiconductor portion arranged at a portion deeper than the first semiconductor portion and the second semiconductor portion relative to the first face;
a fourth semiconductor portion of a second conductivity type arranged at a portion deeper than the first semiconductor portion and the second semiconductor portion, and arranged in contact with the third semiconductor portion, the second conductivity type being the opposite conductivity type to the first conductivity type; and a fifth semiconductor portion arranged at a portion deeper than the third semiconductor portion and the fourth semiconductor portion relative to the first face, wherein the second semiconductor portion is arranged so as to surround the first semiconductor portion on a projection plane parallel to the first face, when the first semiconductor portion and the second semiconductor portion are vertically projected on the projection plane, wherein the fourth semiconductor portion is arranged so as to surround the third semiconductor portion on the projection plane, when the third semiconductor portion and the fourth semiconductor portion are vertically projected on the projection plane, wherein the first semiconductor portion overlaps the third semiconductor portion on the projection plane, when the first semiconductor portion and the third semiconductor portion are vertically projected on the projection plane, wherein the second semiconductor portion overlaps the fourth semiconductor portion on the projection plane, when the second semiconductor portion and the fourth semiconductor portion are vertically projected on the projection plane, and wherein an impurity concentration of the first semiconductor portion is higher than an impurity concentration of the second semiconductor portion, the photo-detection device further comprising a sixth semiconductor portion of the second conductivity type, wherein the sixth semiconductor portion is arranged so as to surround the first semiconductor portion, the second semiconductor portion, the third semiconductor portion, the fourth semiconductor portion and the fifth semiconductor portion on the projection plane, when the first semiconductor portion, the second semiconductor portion, the third semiconductor portion, the fourth semiconductor portion, the fifth semiconductor portion, and the sixth semiconductor portion are vertically projected on the projection plane, wherein the voltage supply unit is configured to supply:

a first voltage to the fourth semiconductor portion, a second voltage that is different from the first voltage to the sixth semiconductor portion, and a third voltage to the third semiconductor portion, and wherein a voltage difference between the first voltage and the third voltage is greater than a voltage difference between the second and the third voltage.

2. The photo-detection device according to claim 1, wherein an impurity concentration of the third semiconductor portion is lower than the impurity concentration of the first semiconductor portion, and wherein a whole portion of the first semiconductor portion overlaps the third semiconductor portion on the projection plane.

3. The photo-detection device according to claim 1, wherein the pixel unit includes a plurality of pixels, and wherein the sixth semiconductor portion is an isolation portion that electrically isolates each of the plurality of pixels arranged in the pixel unit.

4. The photo-detection device according to claim 1, wherein the pixel unit includes a plurality of pixels, wherein the third semiconductor portion and the fourth semiconductor portion form a PN junction, wherein the sixth semiconductor portion is an isolation portion that electrically isolates each of the plurality of pixels arranged in the pixel unit, wherein the first voltage that is different from the third voltage is supplied to the fourth semiconductor portion such that a voltage difference causing a reverse bias is applied to the PN junction, and wherein the second voltage that is different from both the third voltage and the first voltage is supplied to the sixth semiconductor portion.

5. The photo-detection device according to claim 4 further comprising an active quench circuit configured to perform control to stop avalanche amplification by changing a voltage difference applied to the PN junction such that the voltage difference of the PN junction is lower than a breakdown voltage.

6. The photo-detection device according to claim 5, wherein the active quench circuit changes an electric potential of the fourth semiconductor portion.

7. A photo-detection system comprising:

the photo-detection device according to claim 1; and a signal processing unit configured to process a signal output from the photo-detection device.

8. A photo-detection system comprising:

a wavelength conversion unit configured to convert a light in a first wavelength band to a light in a second wavelength band that is different from the first wavelength band;

a plurality of photo-detection devices according to claim 1 configured to receive the light in the second wavelength band converted by the wavelength conversion unit; and a signal processing unit configured to perform a synthesis process of a plurality of images based on a plurality of signals acquired by the plurality of photo-detection devices.

9. A photo-detection system comprising:

a light emitting unit configured to emit a light;

the photo-detection device according to claim 1 configured to detect the light; and a distance calculation unit configured to perform distance calculation by using a signal based on the light detected by the photo-detection device.

10. A mobile apparatus comprising:

the photo-detection device according to claim 1;

a distance information acquisition unit configured to acquire distance information on a distance to an object, from a parallax image based on signals from the photo-detection device; and a control unit configured to control the mobile apparatus based on the distance information.

11. The photo-detection device according to claim 1, wherein the fifth semiconductor portion is arranged in contact with the third semiconductor portion and the fourth semiconductor portion.

* * * * *